(12) United States Patent  (10) Patent No.: US 9,665,488 B2
Offen et al.  (45) Date of Patent: *May 30, 2017

(54) TECHNIQUE TO SHARE INFORMATION AMONG DIFFERENT CACHE COHERENCY DOMAINS (71) Applicant: Intel Corporation, Santa Clara, CA (US)

(72) Inventors: Zeev Offen, Folsom, CA (US); Ariel Berkovits, Yuvalim (IL); Thomas A. Piazza, Granite Bay, CA (US); Robert Farrell, Granite Bay, CA (US); Altug Koker, El Dorado Hills, CA (US); Opher Kahn, Zichron Yacov (IL)

(73) Assignee: Intel Corporation, Santa Clara, CA (US)

( * ) Notice: Subject to any disclaimer, the term of this patent is extended or adjusted under 35 U.S.C. 154(b) by 23 days.

This patent is subject to a terminal disclaimer.

(21) Appl. No.: 14/158,865

(22) Filed: Jan. 20, 2014

(65) Prior Publication Data

US 2014/0136797 A1   May 15, 2014

Related U.S. Application Data (63) Continuation of application No. 13/722,440, filed on Dec. 20, 2012, now Pat. No. 8,643,660, which is a
(Continued)

(51) Int. Cl.
*G06T 9/00* (2006.01)
*G06F 12/0831* (2016.01)
(Continued)

(52) U.S. Cl.
CPC ...... *G06F 12/0831* (2013.01); *G06F 12/0811* (2013.01); *G06F 12/0822* (2013.01);
(Continued)

(58) Field of Classification Search
CPC ............... G06F 12/0897; G06F 12/084; G06F 12/0875; G09G 2360/121
See application file for complete search history.

(56) References Cited

U.S. PATENT DOCUMENTS 4,991,081 A   2/1991 Bosshart
6,237,064 B1  5/2001 Kumar et al.
(Continued)

FOREIGN PATENT DOCUMENTS

CN   1666182 A   9/2005
CN   101042679 A  9/2007
(Continued)

OTHER PUBLICATIONS

Final Office Action received for U.S. Appl. No. 12/057,601, mailed on Aug. 16, 2011, 9 pages.
(Continued)

*Primary Examiner* — Hau Nguyen
(74) *Attorney, Agent, or Firm* — Vecchia Patent Agent, LLC (57) ABSTRACT A technique to enable information sharing among agents within different cache coherency domains. In one embodiment, a graphics device may use one or more caches used by one or more processing cores to store or read information, which may be accessed by one or more processing cores in a manner that does not affect programming and coherency rules pertaining to the graphics device.

16 Claims, 4 Drawing Sheets

Related U.S. Application Data continuation of application No. 13/447,279, filed on Apr. 15, 2012, now Pat. No. 9,035,960, which is a continuation of application No. 12/057,601, filed on Mar. 28, 2008, now Pat. No. 9,035,959.

(51) Int. Cl.
  *G06F 12/0817* (2016.01)
  *G06F 12/0811* (2016.01)
  *G06T 1/60* (2006.01)

(52) U.S. Cl.
  CPC ...... *G06F 12/0828* (2013.01); *G06F 12/0835* (2013.01); *G06T 1/60* (2013.01)

(56) References Cited

U.S. PATENT DOCUMENTS

| | | | |
|---|---|---|---|
| 6,483,516 | B1 | 11/2002 | Tischler et al. |
| 6,891,543 | B2 | 5/2005 | Wyatt |
| 7,023,445 | B1 | 4/2006 | Sell |
| 7,814,279 | B2 | 10/2010 | Clark et al. |
| 2002/0116576 | A1 | 8/2002 | Keshava et al. |
| 2003/0210248 | A1 | 11/2003 | Wyatt |
| 2005/0240850 | A1 | 10/2005 | Ohwada et al. |
| 2006/0080508 | A1 | 4/2006 | Hoover et al. |
| 2006/0095672 | A1 | 5/2006 | Andrews et al. |
| 2006/0098022 | A1 | 5/2006 | Andrews et al. |
| 2006/0271743 | A1 | 11/2006 | Clark et al. |
| 2007/0186057 | A1 | 8/2007 | Moll et al. |
| 2007/0214321 | A1 | 9/2007 | Shannon et al. |
| 2008/0046658 | A1 | 2/2008 | Goodman et al. |
| 2009/0153211 | A1* | 6/2009 | Hendin ............... G06F 1/3203 327/198 |
| 2010/0235542 | A1 | 9/2010 | Visharam et al. |

FOREIGN PATENT DOCUMENTS

| | | |
|---|---|---|
| DE | 102007012058 A1 | 1/2008 |
| GB | 2487328 A | 7/2012 |
| GB | 2490821 A | 11/2012 |
| JP | 10-214222 | 11/1998 |
| JP | 2000-305841 | 2/2000 |
| JP | 2004-326633 | 11/2004 |
| JP | 2007-080266 | 3/2007 |
| JP | 2007-257631 | 4/2007 |
| JP | 2007-207223 | 8/2007 |
| JP | 2007-257637 A | 10/2007 |
| JP | 2008-097598 | 4/2008 |
| JP | 2011-515001 A | 5/2011 |
| WO | 2009120997 A2 | 10/2009 |
| WO | 2009120997 A3 | 12/2009 |

OTHER PUBLICATIONS

Non-Final Office Action received for U.S. Appl. No. 12/057,601, mailed on Jan. 31, 2011, 9 pages.
Notice of Allowance received for U.S. Appl. No. 12/057,601, mailed on Apr. 14, 2015, 5 pages.
Final Office Action received for U.S. Appl. No. 13/447,279, mailed on Apr. 5, 2013, 8 pages.
Final Office Action received for U.S. Appl. No. 13/447,279 mailed on Aug. 1, 2014, 10 pages.
Non-Final Office Action received for U.S. Appl. No. 13/447,279, mailed on Jan. 30, 2014, 12 pages.
Non-Final Office Action received for U.S. Appl. No. 13/447,279, mailed on Oct. 15, 2012, 8 pages.
Notice of Allowance received for U.S. Appl. No. 13/447,279, mailed on Mar. 30, 2015, 5 pages.
Notice of Allowance received for U.S. Appl. No. 13/447,279, mailed on Dec. 17, 2014, 5 pages.
Notice of Allowance received for U.S. Appl. No. 13/722,440, mailed on Oct. 2, 2013, 8 pages.
Non-Final Office Action received for U.S. Appl. No. 13/722,440, mailed on Apr. 22, 2013, 6 pages.
Notice of Allowance received for U.S. Appl. No. 13/844,214, mailed on Mar. 24, 2015, 5 pages.
Non-Final Office Action received for U.S. Appl. No. 13/844,214, mailed on Oct. 23, 2014, 8 pages.
Office Action received for Chinese Patent Application No. 200980110677.8, mailed on Nov. 14, 2012, 8 pages of English Translation and 5 pages of Chinese Office Action.
Office Action received for Chinese Patent Application No. 200980110677.8, mailed on Feb. 15, 2012, 6 pages of English Translation and 5 pages of Chinese Office Action.
Office Action received for Chinese Patent Application No. 200980110677.8, mailed on Jul. 17, 2013, 4 pages of English Translation and 3 pages of Chinese Office Action.
Office Action received for Chinese Application No. 200980110677.8, mailed on Apr. 8, 2014, 4 pages of English Translation and 3 pages of Chinese Office Action.
Office Action received for Chinese Patent Application No. 201210576427.7, mailed on Jun. 2, 2015, 7 pages of Chinese Office Action including 2 pages of Search report.
Office Action received for German Patent Application No. 112009000373.7, mailed on Apr. 8, 2011, 2 pages of English Translation and 3 pages of German Office Action.
Office Action received for United Kingdom Patent Application No. 1207247.6, mailed on May 11, 2012, 4 pages.
Office Action received for United Kingdom Patent Application No. 1214187.5, mailed on Sep. 5, 2012, 4 pages.
Office Action received for United Kingdom Patent Application No. 1221421.9, mailed on Dec. 12, 2012, 8 pages.
Office Action received for United Kingdom Patent Application No. 1222945.6, mailed on Jan. 18, 2013, 6 pages.
Office Action received for Japanese Patent Application No. 2010-550927, mailed on Jul. 30, 2013, 3 pages of English Translation and 3 pages of Japanese Office Action.
Office action received for Japanese Patent Application No. 2012-279612 ;mailed on Jul. 23, 2013, 3 pages of English Translation and 4 pages of Japanese Office Action.
Office Action received for Japanese Patent Application No. 2012-279612, mailed on Feb. 18, 2014, 3 pages of English Translation and 2 pages of Japanese Office Action.
Office Action received for Japanese Patent Application No. 2013-241853, mailed on Feb. 24, 2015, 3 pages of English Translation and 3 pages of Japanese Office Action.
Office Action received for Japanese Patent Application No. 2013-241853, mailed on Jul. 8, 2014, 5 pages of English Translation and 5 pages of Japanese Office Action.
Shiota, Shinji, "Intel's Innovative Technologies", ASCII,Technologies, Feb. 24, 2011, vol. 16, No. 4, 13 pages including 1 page of English Abstract.
Office Action received for Japanese Patent Application No. 2014-008392, mailed on Sep. 24, 2014, 5 pages of English Translation and 5 pages of Japanese Office Action.
Office Action received for Japanese Patent Application No. 2014-008392, mailed on Feb. 24, 2015, 2 pages of English Translation and 2 pages of Japanese Office Action.
Office Action received for Japanese Patent Application No. 2014-124390, mailed on Apr. 28, 2015, 6 pages of English Translation and 4 pages of Japanese Office Action.
International Preliminary Report on Patentability Received for PCT Patent Application No. PCT/US2009/038627, mailed on Sep. 28, 2010, 5 pages
German Office Action, Aug. 18, 2010, 2 pages of English and 3 pages of German.
International Search Report and the Written Opinion of the International Searching Authority, Korean Intellectual Property Office, Republic of Korea, Nov. 10, 2009,11 pages.
Andrews, et al., "XBox 360 System Architecture," Microsoft Corporation, Published by IEEE Computer Society, (Document 0272-1732), 2006, 37 pages.
Lanterman, "Architectural Comparison: Xbox 360 vs. Playstation 3," School of Electrical and Computer Engineering, ECE4893A/

(56) References Cited

OTHER PUBLICATIONS

CS4803MPG: Multiccore and GPU Programming for Video Games, Georgia Institute of Technology, Sep. 26, 2007, 23 pages.
Office Action, Japanese Patent Application No. 2010-550927, mailed Feb. 5, 2013.
Office Action, Japanese Patent Application No. 2010-550927, mailed Feb. 5, 2013—English translation.
Office Action, Japanese Patent Application No. 2010-550927, mailed Sep. 11, 2012.
Office Action, Japanese Patent Application No. 2010-550927, mailed Sep. 11, 2012—English Translation.
Notice of Allowance received for GB Patent Application No. 1214187.5, mailed on Jan. 2, 2013, 2 pages.
Notice of Allowance received for GB Patent Application No. 1221421.9, mailed on Feb. 26, 2013, 2 pages.
Notice of Allowance received for Chinese Patent Application No. 200980110677.8, mailed on Dec. 18, 2014, 4 pages (2 pages of English translation).
Office Action received for Chinese Patent Application No. 201210576427.7, mailed on Apr. 5, 2016, 7 pages (4 pages of English translation).
Notice of Allowance received for Japanese Patent Application No. 2013-241853, mailed on Jan. 19, 2016.
Notice of Allowance received for Japanese Patent Application No. 2014-008392, mailed on Jan. 19, 2016.
Office Action received for Chinese Patent Application No. 201410024970.5, mailed on Apr. 5, 2016, 7 pages (5 pages of Office Action and 2 pages of Search Report).
Notice of Allowance received for Japanese Patent Application No. 2014-124390, mailed on Jan. 19, 2016.
Notice of Allowance received for Chinese Patent Application No. 201210576427.7, mailed on Nov. 11, 2016, 4 pages (2 pages of English translation).

\* cited by examiner

TECHNIQUE TO SHARE INFORMATION AMONG DIFFERENT CACHE COHERENCY DOMAINS

RELATED APPLICATIONS

This is a Continuation of application Ser. No. 13/722,440, filed Dec. 20, 2012, currently pending, which is a Continuation of application Ser. No. 13/447,279, filed Apr. 15, 2012, currently pending, which is a Continuation of application Ser. No. 12/057,601, filed Mar. 28, 2008, currently pending.

FIELD OF THE DISCLOSURE

Embodiments of the invention relate generally to the field of information processing. More particularly, embodiments of the invention relate to techniques to enable cache coherency among agents operating in at least two different cache coherency domains.

BACKGROUND OF THE DISCLOSURE

As more functionality is integrated into computing platforms and microprocessors, information sharing among different functional units tends to increase. For example, the integration of graphics or other throughput logic into the same computing platform, package, or integrated circuit as one or more host central processing units (CPUs), or "cores", may make it desirable to share information between the one or more cores and the graphics logic. In some prior art instances, where different functional units are integrated in the same system, package, or die, the information accessed (stored or read) by one or more cores is maintained in a corresponding cache hierarchy (e.g., level-1, mid-level, level-2 caches) that is in a different coherency domain than that of other functional units, such as graphics logic.

Maintaining data in different coherency domains among different cache addresses or according to different cache coherency domains, may require more cache memory to be used, which may increase system cost and power consumption. Moreover, in situations in which information is shared among the different functional units, maintaining different corresponding cache hierarchy domains can cause each functional unit to have to access a main memory source, such as DRAM, to share information among the different functional units. Main memory sources, such as DRAM, are typically slower in terms of access speed than other memory structures, such as cache. Therefore, resorting to main memory to share information among different functional units can degrade performance of the functional units and/or system.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION

Embodiments of the invention relate to computer systems and information processing. More particularly, embodiments of the invention relate to techniques to allow at least one central processing unit (CPU) to gain visibility into, and therefore some level of coherence with, information being accessed or generated by another processing logic (e.g., graphics processing logic), which may operate in a different coherency domain than the at least one CPU. In some embodiments, one or more CPUs share a level of cache, such as a "last level cache" (LLC) or "level-2" (L2) cache, with one or more processing logic (e.g., graphics logic), which may implement a different coherency protocol or otherwise operate in a different coherency domain from the one or more CPUs. In one embodiment, a CPU and graphics logic are integrated within the same die, package, or system, and the CPU may have access to at least one level of cache in the graphics logic's cache coherency hierarchy as well as an LLC, which the graphics logic may also access, thereby allowing information to be shared between the CPU and the graphics logic without accessing a main memory source, such as DRAM.

Figure 1:
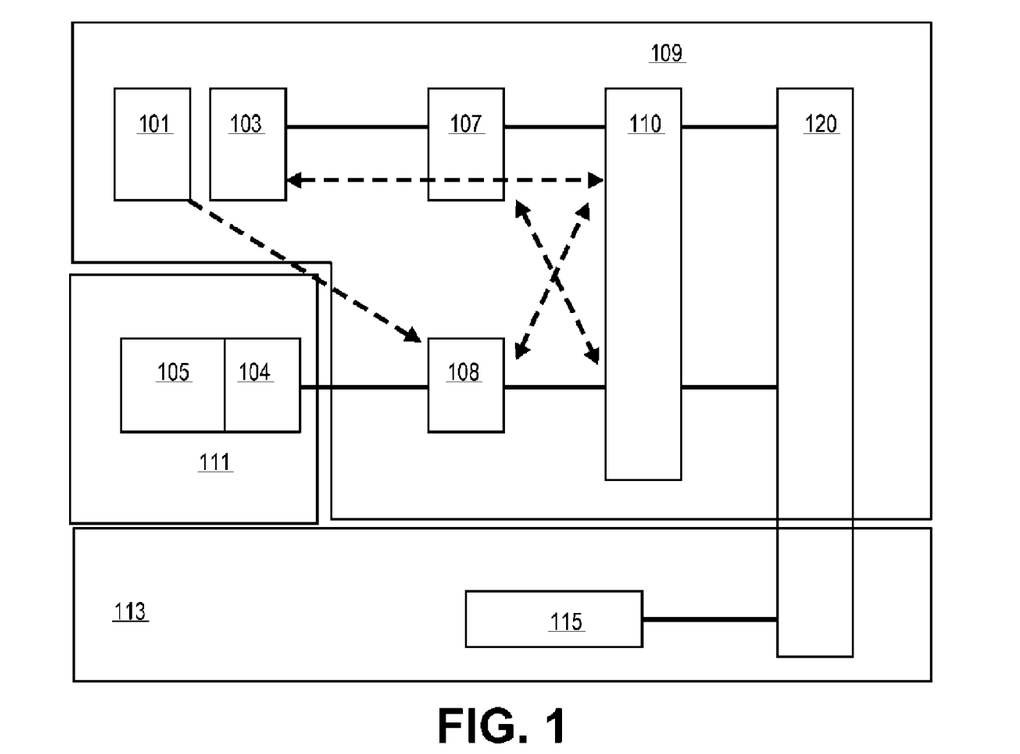
FIG. 1 illustrates a block diagram of a system, in which at least one embodiment of the invention may be used.

FIG. 1 illustrates a system in which at least one embodiment may be used. In FIG. 1, at least one CPU 101 and at least one graphics logic 105 are integrated within the same die, package, or system. Moreover, in one embodiment, the CPU and the graphics logic communicate with a respective cache hierarchy, which may include a first level cache, or "level-1" (L1) cache 103, 104, a mid-level cache 107, 108, and a last-level (LLC), or "level-2" (L2), cache 110. In one embodiment, each L1 and mid-level caches are different logical structures, whereas the LLC is one cache structured that may store the same information, and is therefore inclusive of information, stored in each of the CPU's L1 and MLC, as well as the graphics logic's MLC. In one embodiment, the LLC can be inclusive of the graphic logic's L1 cache by the graphics logic moving or copying the contents of its L1 cache 104 to its MLC 108, which maintains coherency with the LLC vis-a-vis the CPU coherency control operations. By copying or moving information the graphics L1 cache 104 (which is in the graphics coherency domain 111) and the graphics MLC (which is in the CPU coherency domain 109), information may be share between the CPU coherency domain 109 (which includes the CPU 101, L1 cache 103, MLC 107, and LLC 110, in one embodiment) and the graphics coherency domain 111 (which includes graphics logic 105 and graphics L1 cache 104, in one embodiment).

In some embodiments, information stored in the graphics L1 cache 104, which may be addressed virtually by the graphics logic, is moved or copied to the graphics MLC 108 in response to the occurrence of various events associated with rendering a graphics image. In one embodiment, the moving/copying of information from the graphics L1 cache 104 to the MLC 108 is managed and performed by a graphics driver or some other logic or software program. After an event that causes the information in the graphics L1 cache 104 to be moved or copied to the MLC 108, the information is then within the CPU coherency domain and may be addressed and accessed by the CPU using physical addresses, in one embodiment, or other addressing schemes used by the CPU (e.g., virtual addresses).

In addition to the CPU and graphics coherency domains, the system of FIG. 1 also includes a display device (e.g., monitor) 115 that may be in its own coherency domain 113, which is non-coherent with respect to the CPU and graphics coherency domains. In one embodiment, display device 115 may communicate with a main system memory 120, instead of directly with the caches within the cache hierarchies of the CPU or graphics logic.

In one embodiment, the graphics logic 105 may have access to information available or modifiable by the CPU without resorting to system memory 120, by accessing information stored by the CPU within the LLC 110 and snooping information in CPU's L1 (103) and CPU's MLC (107). Moreover, in one embodiment, the CPU may access, or "snoop", information stored in the graphics logic's mid-level cache 108 without resorting to the LLC 110 or system memory 120. In one embodiment, information may be shared between the CPU coherency domain and the graphics logic coherency domain without the CPU or graphics device having to access main system memory, which take a significant amount of time relative to accessing the cache hierarchy. Moreover, in one embodiment, information may be shared between the CPU and graphics logic coherency domains without significantly altering or impacting the respective CPU or graphics cache coherency protocols.

In one embodiment, the graphics logic generates virtual addresses to access data within its cache coherency domain (111). However, some of the caches within the graphics coherency domain, such as those that are only read or otherwise "owned" by the graphics logic ("R/O caches"), may use only virtual tags, whereas other caches within the graphics coherency domain, such as those that are both read and written by the graphics logic ("R/W caches"), may use both virtual and physical tags in order to support both virtual and physical addressing. In one embodiment, graphics logic accesses to the cache hierarchy will be translated from virtual to physical addresses if there is a cache miss, so that the proper physical address in system memory can be generated.

In the CPU coherency domain, at least two rules may apply. First, cache coherency rules may require that access ordering on a per location basis are sequentially consistent with each other. Sequentially consistent accesses requires global, in-order, visibility for all operations accessing a cache location. Secondly, CPU ordering rules typically require writes by a single processor be observed to be the same by all processors, but writes from different processor may be observed in different orders. However, a processor must observe its own writes in the order of execution.

Graphics cache coherency domains can differ from those of a host CPU in a number of ways. For one, in graphics cache domains, coherency may only be guaranteed at certain points in the image rendering process, whereas coherency in typical CPU cache domains is continuously maintained. In addition, because graphics coherency domain caches are typically virtually addressed and not snooped, inclusion of information stored in the L1 or mid-level caches (MLC) within the LLC is not guaranteed. Therefore, when a line is evicted from the LLC the lower level caches may not be updated. To compensate, graphics logic may use an invalid-to-modified ("ItoM") transaction to perform these eviction write-back transactions for full line evictions and read-for-ownership (RFO) transactions for partial line evictions. Lastly, graphics devices are typically non-speculative, out-of-order machines connected to an out of order un-core fabric. Because graphics logic cannot typically reorder accesses after issuing them to the cache hierarchy or memory, dependent accesses must ensure that their predecessor has been globally observed before they are issued.

Embodiments of the invention take into account differences between the graphics and CPU cache coherency domains while allowing data to be shared between the domains without resorting to accessing main system memory. In one embodiment, CPU cache coherency rules apply to any physically addressed structure, including the graphics logic's mid-level cache, LLC, and main memory. For cross-coherency boundary accesses between the CPU and graphics domains, the CPU may snoop the graphics MLC, which will behave the same as in the CPU coherency domain. Moreover, embodiments of the invention allow for the inclusion of data stored in the graphics L1 and MLC within the LLC, so that the graphics logic may make use of the LLC without resorting the main system memory. In one embodiment, data from the graphics L1 is included in the LLC by the graphics device copying or moving L1 data to its MLC in response to a rendering event, thereby putting the graphics L1 data within the CPU coherency domain and ensuring its inclusion the LLC. The graphics logic can then access this information later from the LLC if it's not found within the graphics L1 or MLC.

Figure 2:
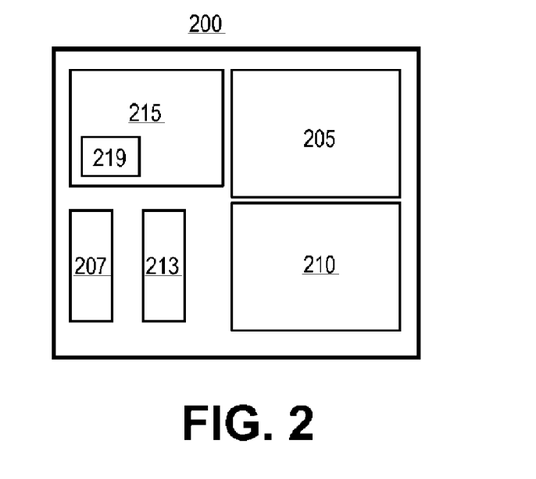
FIG. 2 illustrates a processor in which at least one embodiment of the invention may be used.

FIG. 2 illustrates a processor in which at least one embodiment of the invention may be used. In particular, FIG. 2 illustrates processor 200 having one or more central processing units (CPUs) 205 and 210 and at least one non-CPU functional unit 207 and 213, respectively. Also illustrated in FIG. 2 is at least one other non-CPU functional unit 215 which may perform other operations not performed by functional units 207 and 213. In one embodiment, the functional units 207, 213, and 215 may include functions such as graphics processing, memory control and peripheral control, such as audio, video, disk control, digital signal processing, etc. In some embodiments, processor 200 may also include other logic not shown in FIG. 2, such as I/O control. In one embodiment, each processor in a multi-processor system or each processor core in a multi-core processor may include or otherwise be associated with logic 219 to enable information sharing between one or more CPUs and one or more graphics logic.

In some embodiments, the processor 200 may be a general purpose CPU. In other embodiments, the processor may be either a general purpose CPU or hardware that can perform graphics-specific functions within a system that may include both general purpose CPU integrated circuits as well as graphics-specific hardware or other parallel computational hardware. As general purpose computing becomes more integrated with parallel computational hardware, such as graphics engines, texture samples, etc., the more versatile and location-independent the logic 219 becomes. As a result, logic 219 could include hardware/software or any combination thereof and be located or integrated within or outside of any portion of the processor 200.

In one embodiment, logic 219 includes logic for enabling a CPU to snoop a graphics MLC without significantly modifying the cache coherency rules of either the CPU or the graphics logic. Moreover, logic 219 may include logic to allow the graphics device to access information within an LLC without first resorting to main memory. In addition, logic 219 may help to inform the CPU when information stored in the graphics L1 cache is now present in the graphics MLC, so that the CPU may snoop it.

Figure 3:
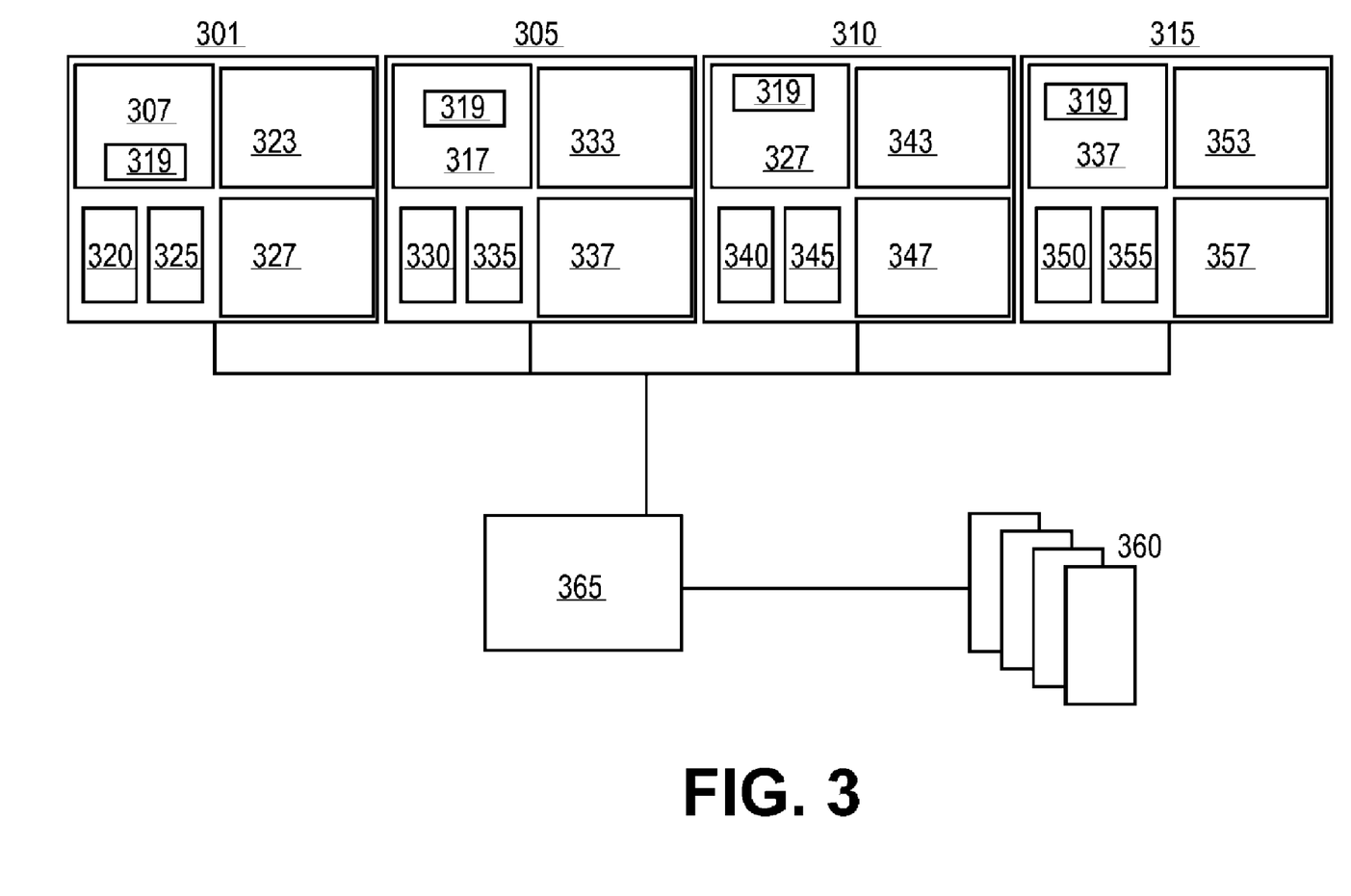
FIG. 3 illustrates a block diagram of a shared bus computer system, in which at least one embodiment of the invention may be used.

FIG. 3 illustrates a shared-bus computer system in which one embodiment of the invention may be used. Microprocessors 301-315 may contain various functional units, such as one or more CPUs (323, 327, 333, 337, 343, 347, 353, 357), graphics device (307, 317, 327, 337), memory controller (325, 335, 345, 355), I/O control, or other functional units, such as a PCI or PCIe controller (320, 330, 340, 350). The system of FIG. 3 may also include an I/O controller 365 to interface the microprocessors to peripheral control devices 360.

In one embodiment, the system includes logic 319 for enabling a CPU to snoop a graphics MLC without significantly modifying the cache coherency rules of either the CPU or the graphics logic. Moreover, logic 319 may include logic to allow the graphics device to access information within an LLC without first resorting to main memory. In addition, logic 219 may help to inform the CPU when information stored in the graphics L1 cache is now present in the graphics MLC, so that the CPU may snoop it.

In some embodiments, some or all of the elements illustrated in FIG. 3 may be included in a microprocessor and include other interconnects, such as direct memory interface (DMI), a PCI express graphics (PEG) interconnect, etc. Regardless of configuration, embodiments of the invention may be included or otherwise associated with any portion of the system of FIG. 3. The system of FIG. 3 may also include main memory (not shown), which may be include various memory structures, such as dynamic random-access memory (DRAM), a hard disk drive (HDD), or a memory source located remotely from the computer system via network interface containing various storage devices and technologies. Cache memory within the system of FIG. 3 may be located either within a processor or in close proximity to a processor, such as on the processor's local bus.

Furthermore, the cache memory may contain relatively fast memory cells, such as a six-transistor (6T) cell, or other memory cell of approximately equal or faster access speed.

In addition to the shared-bus computer system illustrated in FIG. 3, other system configurations may be used in conjunction with various embodiments of the invention, including point-to-point (P2P) interconnect systems and ring interconnect systems. The P2P system of FIG. 4, for example, may include several processors, of which only two, processors 470, 480 are shown by example. Processors 470, 480 may each include a local memory controller hub (MCH) 472, 482 to connect with memory 42, 44. Processors 470, 480 may exchange data via a point-to-point (P2P) interface 450 using P2P interface circuits 478, 488. Processors 470, 480 may each exchange data with a chipset 490 via individual P2P interfaces 452, 454 using point to point interface circuits 476, 494, 486, 498. Chipset 490 may also exchange data with a high-performance graphics circuit 438 via a high-performance graphics interface 439. Embodiments of the invention may be located within any processor having any number of processing cores, or within each of the P2P bus agents of FIG. 4.

Figure 4:
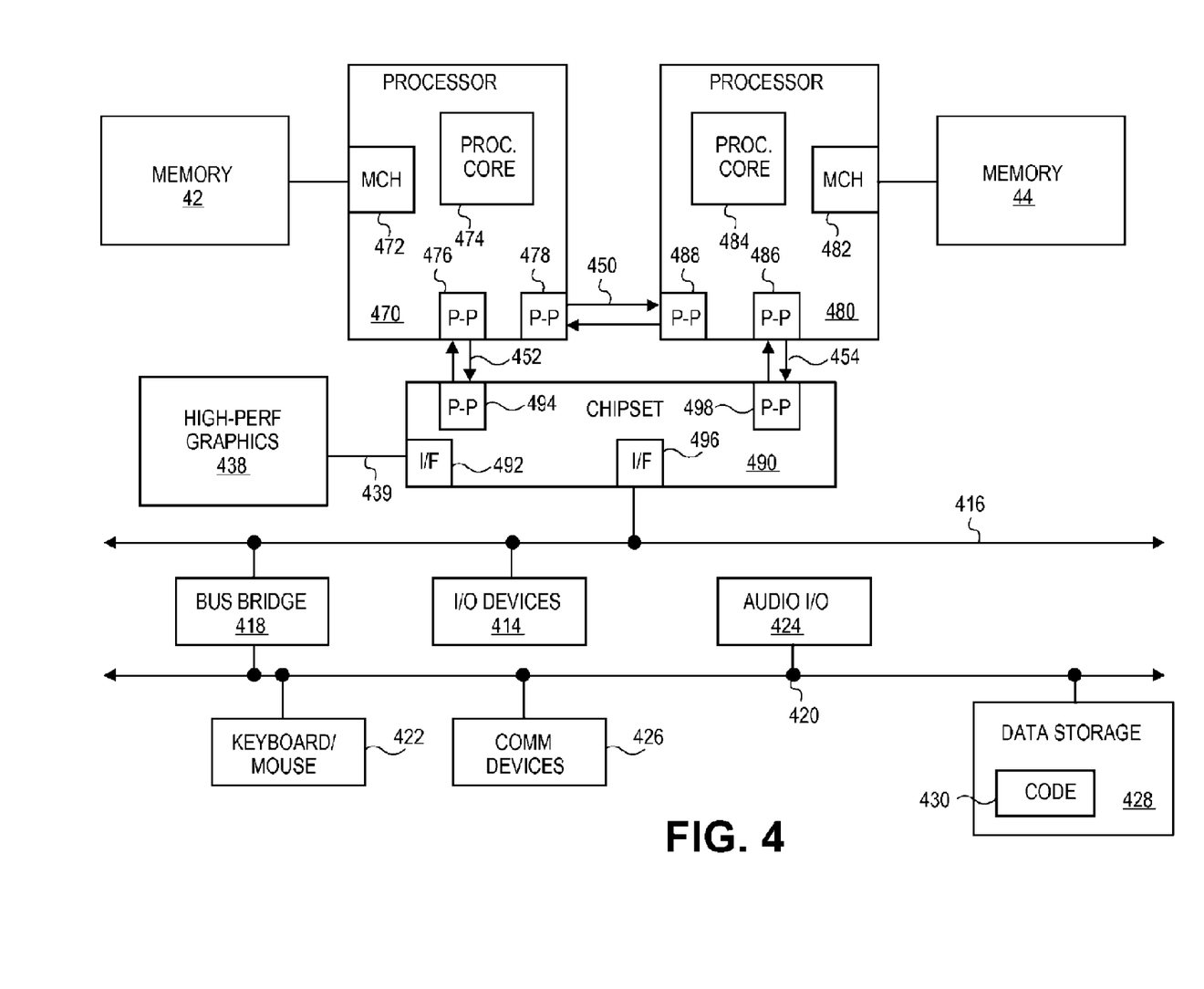
FIG. 4 illustrates a block diagram a point-to-point interconnect computer system, in which at least one embodiment of the invention may be used.

In one embodiment, FIG. 4 includes logic 419 for enabling a CPU to snoop a graphics MLC without significantly modifying the cache coherency rules of either the CPU or the graphics logic. Moreover, logic 419 may include logic to allow the graphics device to access information within an LLC without first resorting to main memory. In addition, logic 219 may help to inform the CPU when information stored in the graphics L1 cache is now present in the graphics MLC, so that the CPU may snoop it.

Figure 5:
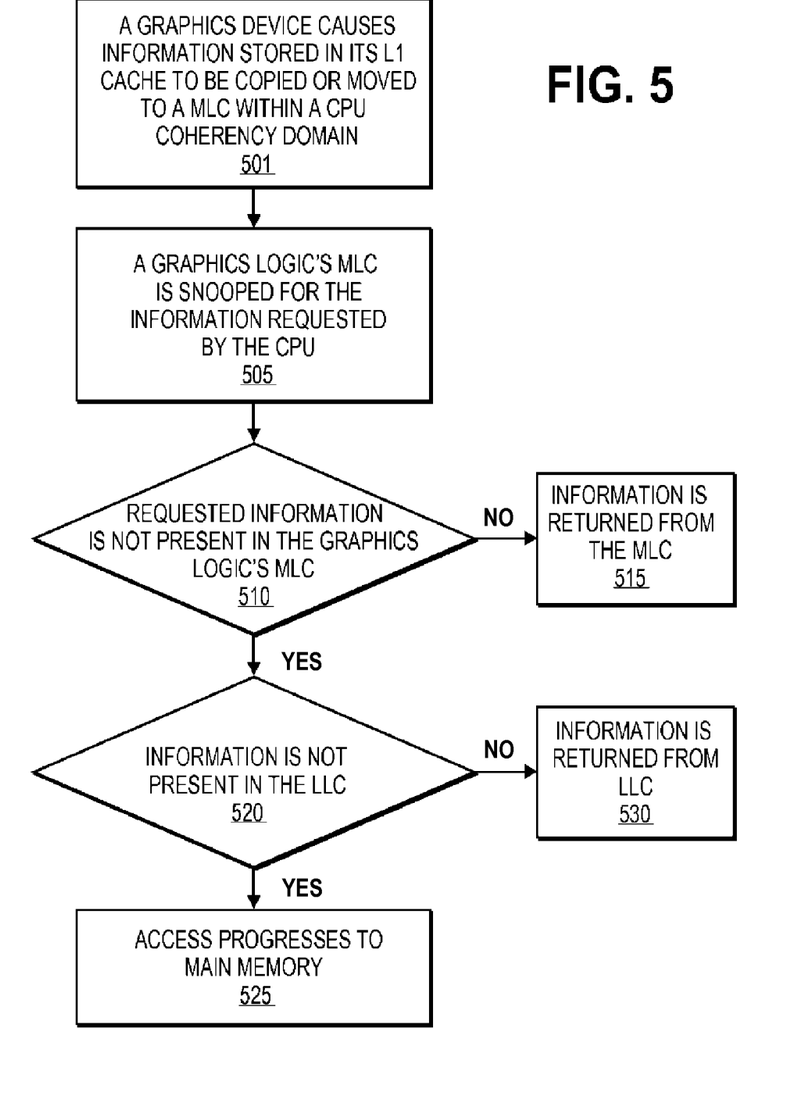
FIG. 5 is a flow diagram illustrating operations that may be used in one embodiment.

FIG. 5 illustrates a flow diagram of operations that may be used in conjunction with at least one embodiment of the invention. At operation 501, a graphics device causes information stored in its L1 cache to be copied or moved to a MLC within a CPU coherency domain and a snoop is issued from a CPU to a graphics logic's MLC for the information requested by the CPU at operation 505. If the requested information is not present in the graphics logic's MLC at operation 510, the snoop may progress to the LLC for the information at operation 520. If the information is not present in the LLC at operation 520, then the access progresses to main memory at operation 525. In one embodiment, the CPU may use physical addresses to snoop the MLC because the MLC contains a physical address tag in addition to the virtual address tag used by the graphics logic. Moreover, because in one embodiment, the graphics logic may store and access information within the LLC, the information requested by the CPU may be within the LLC instead of the MLC.

One or more aspects of at least one embodiment may be implemented by representative data stored on a machine-readable medium which represents various logic within the processor, which when read by a machine causes the machine to fabricate logic to perform the techniques described herein. Such representations, known as "IP cores" may be stored on a tangible, machine readable medium ("tape") and supplied to various customers or manufacturing facilities to load into the fabrication machines that actually make the logic or processor.

Thus, a method and apparatus for directing micro-architectural memory region accesses has been described. It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An apparatus comprising:
a memory controller to provide access to a main memory;
at least one central processing unit having an L1 cache;
an L2 cache coupled to the at least one central processing unit;
a graphics processing unit in a different cache coherency domain than the L1 cache; and
interconnect logic including at least some hardware and coupled to the at least one central processing unit and coupled to the graphics processing unit, the interconnect logic to enable information sharing between the at least one central processing unit and the graphics processing unit and to allow the graphics processing unit to access information within the L2 cache without first resorting to main memory;
wherein the at least one central processing unit and the graphics processing unit maintain coherency with the L2 cache.

2. The apparatus of claim 1, wherein the apparatus is a processor, and wherein the graphics processing unit is integrated with the at least one central processing unit within the processor.

3. The apparatus of claim 1, wherein the graphics processing unit is to implement a first set of cache coherency rules and the at least one central processing unit is to implement a second set of cache coherency rules.

4. The apparatus of claim 3, wherein the first set of cache coherency rules is different from the second set of cache coherency rules.

5. The apparatus of claim 1, wherein the graphics processing unit is to use a different cache coherency protocol than one used for the L1 cache, and wherein the graphics processing unit is to access information from the L2 cache.

6. A microprocessor comprising:
an input/output (I/O) controller;
an audio I/O module;
at least one central processing unit having an L1 cache;
an L2 cache coupled to the at least one central processing unit;
a graphics processing unit in a different cache coherency domain than the L1 cache; and
interconnect logic including at least some hardware and coupled to the at least one central processing unit and coupled to the graphics processing unit, the interconnect logic to enable information sharing between the at least one central processing unit and the graphics processing unit and to allow the graphics processing unit to access information within the L2 cache without first resorting to main memory;
wherein the at least one central processing unit and the graphics processing unit maintain coherency with the L2 cache.

7. The microprocessor of claim 6, wherein the graphics processing unit is to implement a first set of cache coherency rules and the at least one central processing unit is to implement a second set of cache coherency rules.

8. The microprocessor of claim 7, wherein the first set of cache coherency rules is different from the second set of cache coherency rules.

9. A system comprising:
a display device;
a main memory;
an input/output (I/O) controller;
an audio I/O module;
at least one central processing unit having an L1 cache;
an L2 cache coupled to the at least one central processing unit;
a graphics processing unit in a different cache coherency domain than the L1 cache; and
interconnect logic including at least some hardware and coupled to the at least one central processing unit and coupled to the graphics processing unit, the interconnect logic to enable information sharing between the at least one central processing unit and the graphics processing unit and to allow the graphics processing unit to access information within the L2 cache without first resorting to main memory;
wherein the at least one central processing unit and the graphics processing unit maintain coherency with the L2 cache.

10. The system of claim 9, wherein the graphics processing unit is integrated with the at least one central processing unit within a processor.

11. The system of claim 9, wherein the graphics processing unit is to implement a first set of cache coherency rules and the at least one central processing unit is to implement a second set of cache coherency rules.

12. The system of claim 11, wherein the first set of cache coherency rules is different from the second set of cache coherency rules.

13. A system comprising:
a peripheral control device;
an input/output (I/O) controller coupled to the peripheral control device;
at least one central processing unit having an L1 cache;
an L2 cache coupled to the at least one central processing unit;
a graphics processing unit in a different cache coherency domain than the L1 cache; and
interconnect logic including at least some hardware and coupled to the at least one central processing unit and coupled to the graphics processing unit, the interconnect logic to enable information sharing between the at least one central processing unit and the graphics processing unit and to allow the graphics processing unit to access information within the L2 cache without first resorting to main memory;
wherein the at least one central processing unit and the graphics processing unit maintain coherency with the L2 cache.

14. The system of claim 13, wherein the graphics processing unit is integrated with the at least one central processing unit within a processor.

15. The system of claim 13, wherein the graphics processing unit is to implement a first set of cache coherency rules and the at least one central processing unit is to implement a second set of cache coherency rules.

16. The system of claim 15, wherein the first set of cache coherency rules is different from the second set of cache coherency rules.

* * * * *